(12) United States Patent
Liu et al.

(10) Patent No.: US 8,759,903 B1
(45) Date of Patent: Jun. 24, 2014

(54) METHOD OF FABRICATING TOTAL DOSE HARD AND THERMAL NEUTRON HARD INTEGRATED CIRCUITS

(75) Inventors: Michael S Liu, Bloomington, MN (US); David J Swanson, Cokato, MN (US); Bradley J Larsen, Mound, MN (US)

(73) Assignee: Honeywell International Inc., Morristown, NJ (US)

(*) Notice: Subject to any disclaimer, the term of this patent is extended or adjusted under 35 U.S.C. 154(b) by 2184 days.

(21) Appl. No.: 11/469,757

(22) Filed: Sep. 1, 2006

Related U.S. Application Data

(60) Provisional application No. 60/777,433, filed on Feb. 28, 2006.

(51) Int. Cl.
*H01L 29/792* (2006.01)

(52) U.S. Cl.
USPC ........................................................ 257/325

(58) Field of Classification Search
USPC ......... 438/287, 311, 585, 151, 163, 295, 488, 438/522, 592, 660, 663, 510, 530; 257/347, 257/349, 356
See application file for complete search history.

(56) References Cited

U.S. PATENT DOCUMENTS

| | | | | |
|---|---|---|---|---|
| 6,090,666 A | * | 7/2000 | Ueda et al. | 438/257 |
| 6,110,789 A | * | 8/2000 | Rhodes et al. | 438/305 |
| 6,444,495 B1 | * | 9/2002 | Leung et al. | 438/118 |
| 6,559,026 B1 | * | 5/2003 | Rossman et al. | 438/424 |
| 6,586,785 B2 | * | 7/2003 | Flagan et al. | 257/261 |
| 6,642,147 B2 | * | 11/2003 | Dokumaci et al. | 438/691 |
| 2002/0102814 A1 | * | 8/2002 | Olsen | 438/424 |
| 2005/0128788 A1 | * | 6/2005 | Segal et al. | 365/151 |
| 2006/0073667 A1 | * | 4/2006 | Li et al. | 438/311 |
| 2006/0231889 A1 | * | 10/2006 | Chen et al. | 257/325 |

OTHER PUBLICATIONS

Suh S.M, et al., "Modeling Gas-Phase Nucleation in Inductively Coupled Silane-Oxygen Plasmas," J.Vac. Sci. Technology A 21(1), Jan./Feb. 2003, pp. 251-264.
Hole, David E., et al., "Optical Properties of Silicon Nanoclusters Fabricated by Ion Implantation," Journal of Applied Physics, vol. 83, No. 11, Jun. 1, 1998, pp. 6018-6022.
Zhang, Tong-Yi, et al., "Effects of Absorption and Desorption on the Chemical Stress Field," Journal of Applied Physics, vol. 91, No. 4, Feb. 15, 2002, pp. 798-807.

* cited by examiner

*Primary Examiner* — David Vu
*Assistant Examiner* — Jonathan Han
(74) *Attorney, Agent, or Firm* — Shumaker & Sieffert, P.A.

(57) ABSTRACT

A method of increasing the radiation hardness of a semiconductor device using a modified high density plasma oxide (MHDPDX) film is described. In the method a high density plasma (HDP) process is used to deposit the MHDPDX film. During the HDP process, the silicon source gas to oxygen source gas ratio is chosen so as to deposit an excess silicon content within the MHDPDX film. The MHDPDX film is then annealed to cause the excess silicon to migrate and amalgamate, creating silicon nanoclusters having an average size of about 3-5 nm. The rad-hard properties of conventional BPSG films and various MHDPDX films are then compared.

14 Claims, 6 Drawing Sheets

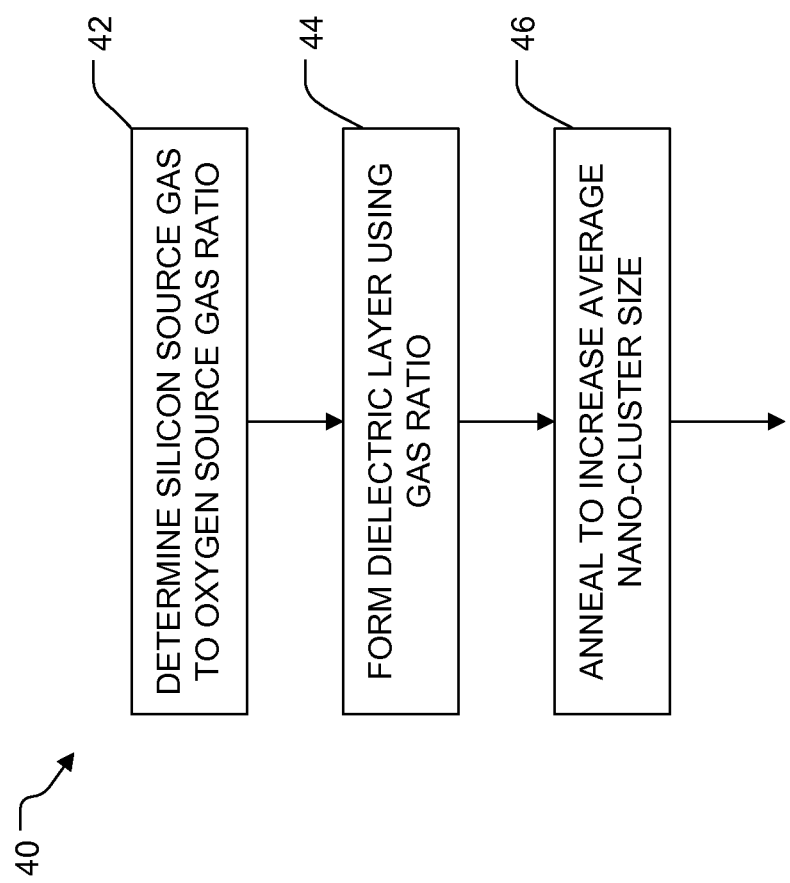

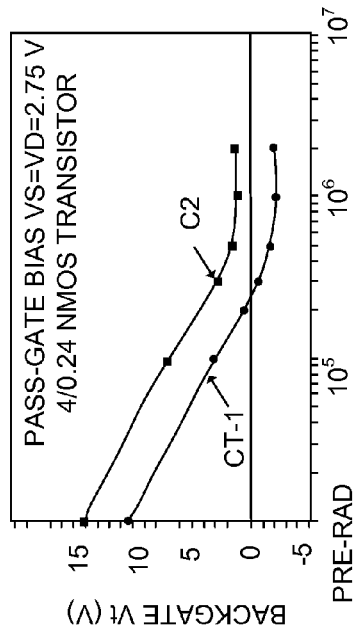
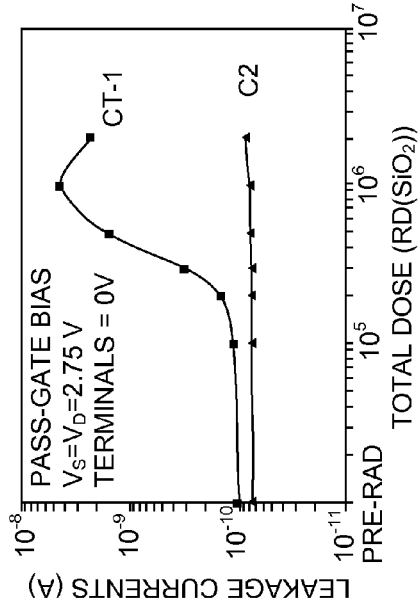
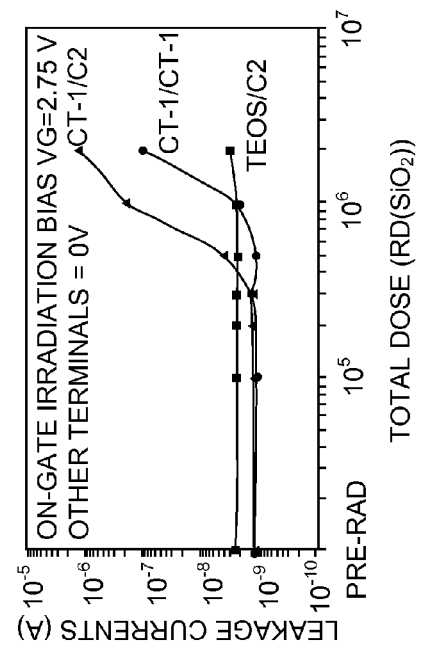
FIG. 5A
FIG. 5B
FIG. 5C

METHOD OF FABRICATING TOTAL DOSE HARD AND THERMAL NEUTRON HARD INTEGRATED CIRCUITS

CROSS-REFERENCE TO RELATED APPLICATIONS

The present application claims priority to U.S. Provisional Application No. 60/777,433, entitled "Method of Fabricating Total Dose Hard and Thermal Neutron Hard Integrated Circuits", filed Feb. 28, 2006, which is hereby incorporated by reference herein in its entirety.

GOVERNMENT RIGHTS

The United States Government may have acquired certain rights in this invention pursuant to Contract No. N000173-01-C-2017 awarded by the Naval Research Laboratory.

FIELD

The invention relates to the field of radiation hardened micro-electronic devices, and more particularly to semiconductor materials suitable for radiation hardening.

BACKGROUND

In harsh ionizing radiation environments, charges can be trapped in various oxide regions in MOS transistors of integrated circuits. The radiation induced charge buildup can cause failure by shifting threshold voltages of MOS transistors and by creating deleterious leakage paths. These effects are especially harmful in thick oxides such as the field oxide (FOX), shallow trench isolation (STI) refilled oxide, and buried oxide (BOX) in devices fabricated in silicon-on-insulator (SOI) material. The net radiation-induced charge is usually found to be positive, causing a negative shift in threshold voltage.

Chemical treatment of these oxides has been found to be effective in reducing the radiation induced charge buildup. Examples of chemically treated films are treated gate oxides with excess silicon or shallow trench and field oxides prepared with boron and phosphorus doping, which is referred to as borophosphosilicate glass (BPSG). Reduction of the charge buildup by chemical treatment of these oxides can be attributed at least partially to electron trapping, which compensates for some of the positive trapped charges.

SUMMARY

As technology advances, some chemical treatments commonly used to harden the oxide are found to have undesirable side effects. For example, the use of BPSG to harden field oxides and STI becomes unacceptable because of the sensitivity of deep submicron CMOS SRAMs to thermal neutrons. This sensitivity is a single event upset (SEU) related reliability issue and has been attributed to the presence of the $^{10}B$ isotope in BPSG. In particular, the thermal neutron $^{10}B$ reaction results in the following products: a gamma, an alpha particle, and a lithium particle. Alpha particles and lithium particles produced in the thermal neutron $^{10}B$ reaction may cause single event upsets in BPSG based SRAMs.

Therefore, a method of radiation hardening a semiconductor device is presented. The described method, in some examples, may be used in lieu of BPSG. In general, the method employs using a dielectric layer that comprises silicon nanoclusters, where the silicon nanoclusters have a preferred range in size. In particular, the method may be used to produce silicon nanoclusters having an average size of about 3 to 5 nm.

In one example, the method includes providing a dielectric layer that is adjacent to a semiconductor device location (i.e., where a device is or will be located) and using an annealing process to anneal the dielectric layer. The dielectric layer includes both silicon nanoclusters and an excess silicon content. When the dielectric layer is annealed, the excess silicon content migrates towards the existing silicon nanoclusters, amalgamates, and causes the average size of the silicon nanoclusters to grow. The time and temperature of the annealing process may be used to increase the average size of the silicon nanoclusters to a size of about 3 to 5 nm.

When the dielectric layer is annealed, an inert gas such as nitrogen ($N_2$) or argon (Ar) may be used to prevent the oxidation of the silicon nanoclusters. A variety of temperature and annealing times may be used to create the preferable size of the silicon nanoclusters. As an example, an anneal temperature range of about 750 to 850° C. and an anneal time range of about 10 to 60 minutes may be used. In another example, an anneal temperature of about 800° C. and an anneal time of about 40 minutes may be used.

In general, the dielectric layer may be positioned in a variety of locations. For example, the dielectric layer may be a portion of a buried oxide, a field oxide, a gate oxide, and/or a shallow trench isolation oxide. If the dielectric is used for a shallow trench isolation oxide, the dielectric layer may be deposited in the trench. Prior to the deposition of the dielectric layer, a thermal oxide may be grown within the trench (e.g., via a thermally oxidative process).

Further a variety of processes may be used to create the dielectric layer. In one example, the dielectric layer is deposited in a chemical vapor deposition (CVD) process. Such a process may be carried out using a silicon source gas, such as $SiH_4$ and an oxygen source gas, such as $O_2$, in a high density plasma process. The ratio of the silicon and oxygen gases may establish the amount of excess silicon deposited within the dielectric layer. A layer grown in such a manner is referred to as a modified high density plasma oxide (MHDPDX) film. In another example, the dielectric layer may be deposited and the silicon nanoclusters may be created by implanting silicon atoms into the dielectric layer.

In an alternative example, a radiation hardened semiconductor device is described. The semiconductor device is adjacent to a silicon oxide layer that comprises silicon nanoclusters having a preferable size range of about 3 to 5 nm. This silicon oxide layer may protect the semiconductor device from ionizing radiation. Furthermore, the silicon oxide layer may comprise a portion of a buried oxide, a field oxide, a gate oxide, and/or a shallow trench isolation oxide.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the appended drawing figures, wherein like reference numerals refer to like elements in the various figures, and wherein:

FIG. 2 is flow diagram of a method for increasing the average size of silicon nanoclusters, according to an example;

FIGS. 5A-C are graphs showing back gate threshold voltages and leakage currents associated with MHPDOX and non-MHDPDX films, according to an example.

DETAILED DESCRIPTION a) Silicon Nanoclusters

To reduce the amount of positive charge trapping within or adjacent to a semiconductor device, a dielectric layer may include silicon nanoclusters. The silicon nanoclusters may also serve as electron traps. Dielectric layers which include nanoclusters may be used to mitigate a microelectronic device from harmful ionizing radiation. Generally speaking, incorporating silicon nanoclusters within a dielectric layer may be useful in radiation hardened applications, or other types of harsh ionizing environments.

Figure 1:
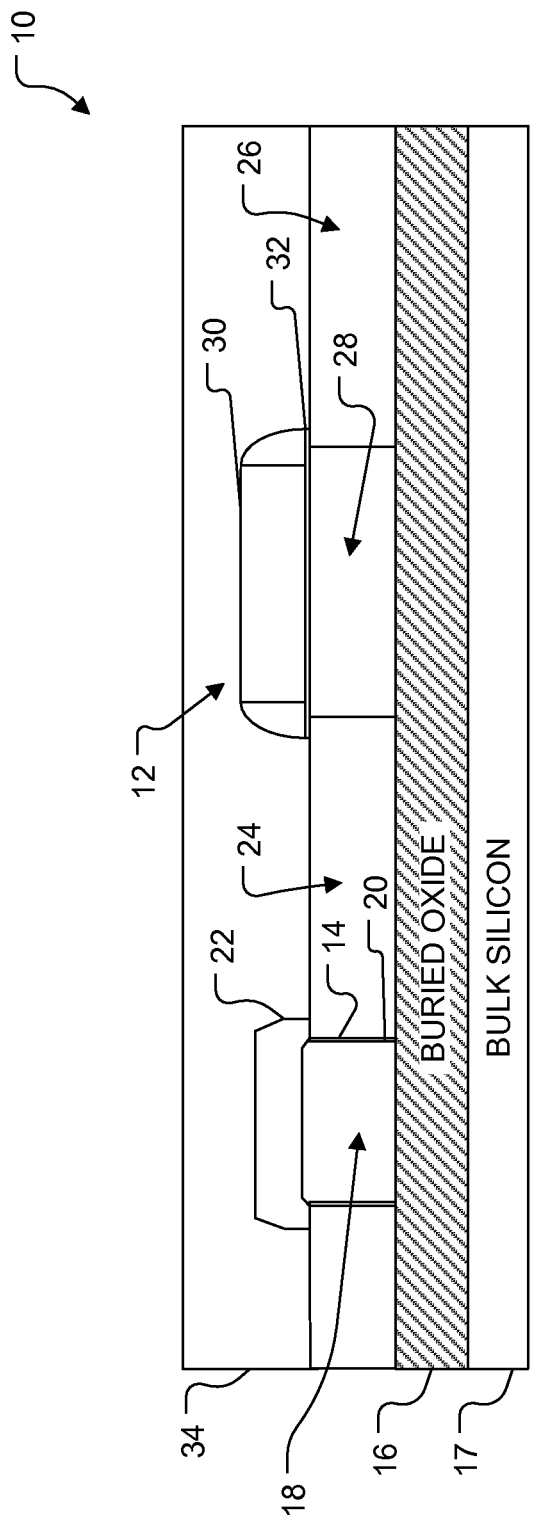
FIG. 1 is cross sectional diagram of a MOS transistor and various dielectric layers, according to an example.

Turning now to the figures, FIG. 1 is a cross-section 10 that shows a MOS transistor 12 and an STI trench 14. The transistor 12 and the trench 14 are positioned on top of a buried oxide layer 16, which is positioned above a bulk substrate layer 17. The STI trench 14 includes a trench fill layer 18 positioned adjacent to a liner oxide 20 and below a trench cap 22. In general, the liner oxide 20 may be a thermal silicon oxide film that is grown in a thermally oxidative process. It should be noted that the liner oxide may also be located below the trench fill 18 (i.e., in a bulk process). The trench cap 22 may be a silicon nitride film that is deposited via a chemical vapor deposition (CVD). The trench fill layer 18, on the other hand, may be deposited via a CVD process, a plasma enhanced CVD (PECVD) process, or a high density plasma process (HDP), for example.

Adjacent to the STI trench 14 is the transistor 12, which includes S/D regions 24, 26 and channel region 28. The transistor 12 also includes a polysilicon gate 30 that is separated from the S/D regions 24, 26 and the channel region 28 by a gate oxide 32. The gate oxide 32 may be a thermally grown silicon dioxide layer, for example.

The transistor 12 is isolated from other devices by a passivation layer 34, such as a pre-metal dielectric layer, or an inter-level dielectric layer. Although not shown, a semiconductor substrate may also include a field oxide layer. Silicon nanoclusters may also be included in any of the above mentioned dielectric layers, or other contemplated dielectric layers. It should be noted that although the description below generally describes radiation hardened MOS based transistors, a variety of devices may also be included in the cross-section 10 or substituted for the transistor 12 (e.g., capacitors, resistors, micro-mechanical devices, etc.).

b) Incorporating Silicon Nanoclusters in a Dielectric Layer

Although there are many types of dielectric layers that silicon nanoclusters may be incorporated in, one example film is referred to as a modified high-density plasma deposited oxide (MHDPDX), prepared in such a manner so as to contain silicon nanoclusters. In an MHDPDX film, a silicon source gas ($SiH_4$), an oxygen source gas ($O_2$), along with an inert carrier gas (e.g., Argon, Nitrogen, etc.) are used in a high density plasma process to grow a silicon oxide film. It should be noted that other deposition or growth processes are possible (e.g., thermal oxidation, CVD, or PECVD), however, HDP allows relatively dense films to be fabricated at relatively low temperatures (i.e., 400° C. or less).

As the MHDPDX film is grown, silicon nanoclusters are created in the film. These silicon nanoclusters are about 2 nm or less in size and are distributed throughout the MHDPDX film. The ratio of the silicon source gas to the oxygen source gas may be chosen so as to deposit excess silicon within the grown silicon oxide film. After the MHDPDX film deposition, the MHDPDX film will be annealed, and the excess silicon will migrate toward the existing silicon nanoclusters, amalgamate, and increase the average size of the silicon nanoclusters to a preferred size, which is in the range of 3-5 nm.

If other types of non-HDP films are used, excess silicon may be deposited within a film via an implantation process, for example. In such a manner, silicon atoms may be implanted at one or more preferred depths within a dielectric layer. The implanted dielectric layer may then be annealed in a manner similar to that which will be described below. However, an MHDPDX film may be preferable as such a film has a more distributed amount of silicon nanoclusters, which are not confined to a particular implantation depth.

FIG. 2 shows a flow diagram that generally illustrates a method 40 for increasing the radiation hardness of an MHDPDX film. A semiconductor device, in turn, by being adjacent to or comprising a portion of the MHDPDX film may likewise have an increased measure of radiation hardness. At block 42, a ratio of the silicon source gas to the oxygen source gas is determined so as to establish an amount of excess silicon within the MHDPDX film. At block 44, an MHDPDX film is grown using the ratio that is determined at the block 42.

At block 46, the MHDPDX film is annealed to increase the size of the silicon nanoclusters to a preferred size in the range of 3-5 nm. It is preferable that the anneal process be non-oxidative (i.e., carried out using an inert or non-oxidative gas), as oxidation of the silicon nanoclusters reduces the average size of the silicon nanoclusters. Furthermore, it should be noted that if a film is provided that already contains silicon nanoclusters (e.g., via an implantation process), the blocks 42, 44 may be adapted accordingly (i.e., prior to the anneal at the block 46).

c) Experimental Setup for Evaluating Various MHDPDX Films

Table 1 refers to nine samples that were prepared using various silane ($SiH_4$) to oxygen ($O_2$) gas ratios and various anneal temperatures. The nine samples were deposited on 6 inch silicon wafers covered with a thin liner oxide 6 nm in thickness. Each sample has a 400 nm thick oxide deposited on top of the liner oxide using a Novellus-2 machine at a temperature below 400° C. The process gases used in the HDP process were silane ($SiH_4$) and oxygen ($O_2$). Composition 1 was grown to be stoichiometric, and has a refractive index (RI) of 1.46. Composition 2 was prepared using a higher silane to oxygen ratio, and has a higher RI of 1.50, indicating the presence of excess silicon. Composition 3 was grown with an even higher silane to oxygen ratio, and has a RI of 1.54. The RI values were measured right after deposition.

After deposition, each set of samples was divided into three groups by annealing 40 minutes in (1) wet oxygen at 780° C. (Group A), (2) dry oxygen at 850° C. (Group B), or (3) in nitrogen at 850° C. (Group C). Table 1 shows the sample notation. For comparison, two control wafers (CT-1 and CT-2) were also prepared. The sample CT1 was taken from composition 1, in-situ doped with boron and phosphorus to form BPSG, and was not annealed. The other sample CT-2 was taken from composition 2, annealed at 1000° C. in nitrogen in an attempt to enlarge the silicon nanoclusters.

TABLE 1

| Composition | Group A | Group B | Group C |
|---|---|---|---|
| 1 | A1 | B1 | C1 |
| 2 | A2 | B2 | C2 |
| 3 | A3 | B3 | C3 | d) Determining Silicon Nanocluster Size

To estimate the average size of the silicon nanoclusters, photoluminescence (PL) measurements were made at room temperature using the 2.5-eV line from an argon laser. Luminescent light was collected using a fiber optic cable placed above the sample. The collected light passed through a 515 nm high pass filter to remove the laser line (496 nm), then struck an optical grating in front of a charge-coupled detector array. Luminescent intensities were not corrected for grating or detector efficiencies, but the laser intensity was checked before each sample to ensure the PL signal from a reference sample remained constant. The system was sensitive to light in the range of 515 to 1000 nm.

Figure 3A:
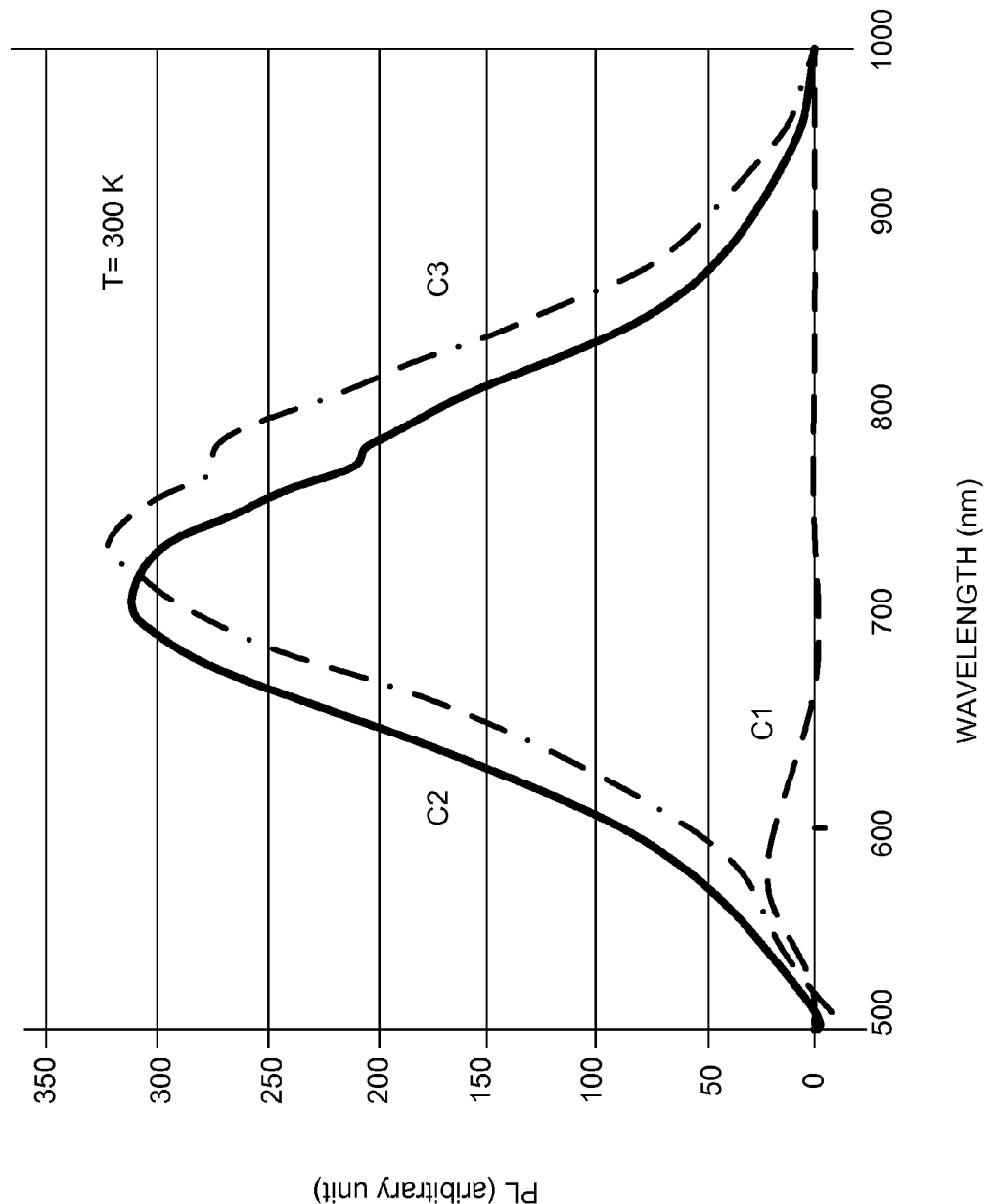
FIGS. 3A-B are graphs showing photoluminescence measurements of MHDPDX films, which can be used to determine the average size of silicon nanoclusters, according to an example.

In general, PL measurements can be used to detect the presence of silicon nanoclusters in a film, and to estimate the size of the silicon nanoclusters. FIG. 3A shows PL measurements from the three samples in group C. The small peak around 550 nm for the sample C1 may be due to extremely small clusters; however, it is more likely the result of PL from the optical filter used in the measurement. The large PL peaks seen for the samples C2 and C3 indicate the presence of silicon nanoclusters in these oxides. From the wavelength (720 to 740 nm) of these peaks, the average silicon nanocluster diameter or size can be estimated to be in the range of about 3-5 nm, where the width of the peaks of the samples C2 and C3 indicating a broad distribution of cluster nanocluster sizes centered at about 3 nm. Note that the shoulder to the right of the peaks is an artifact of the spectrometer.

Figure 3B:
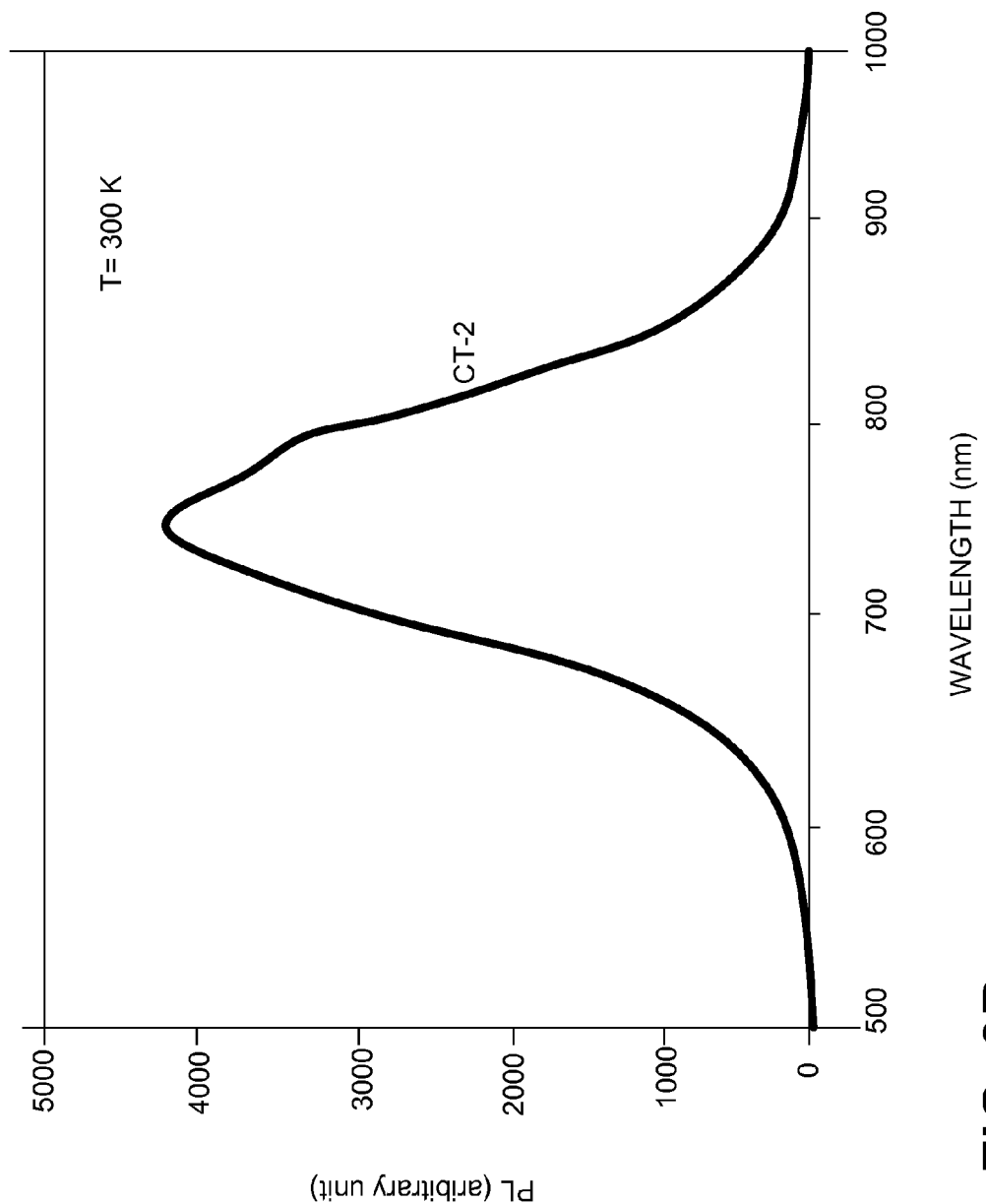

In FIG. 3B, the PL peak for the CT-2 sample (annealed at 1000° C.) is at 750 nm and has nearly ten times the intensity of the largest peak observed in FIG. 1, suggesting larger nanoclusters in the sample CT-2 (i.e, larger than 5 nm). To correlate PL measurements with nanocluster size, further reference may be made to Fernandez et al., "Influence of Average Size and Interface Passivation on the Special Emission of Si Nanocrystals Embedded in $SiO_2$," Journal of Applied Physics, Volume 91, pp. 798-807 (2002) which is hereby incorporated by reference.

Although not shown, the PL wavelengths for the samples in the groups A-B is smaller than those associated with the group C. As described above, the oxidative anneal performed on the samples in groups A-B reduces the overall size of the silicon nanoclusters. As will be shown below, the samples in groups A-B do not provide as significant of a radiation hardness improvement as the samples in group C, in particular the samples C2 and C3.

Furthermore, it should be understood that a variety of anneal times and temperatures may be used to produce a desired average silicon nanocluster size. For example, an MHDPDX film may be annealed in an inert gas at a temperature in a range of about 750 to 850° C., for a time in a range of about 10 to 60 minutes. As another example, the MHDPDX film, or other silicon nanocluster comprising film may be annealed for about forty minutes at a temperature of about 800° C.

e) Radiation Hardness of MHDPDX Films

Trapped Charge Measurements

To determine radiation hardness via trapped charge measurements, two types of metal-oxide-semiconductor capacitor (MOSC) structures were fabricated. For total dose measurements using X-ray irradiation, polycrystalline silicon was deposited on the samples in groups A-C, boron implanted, and rapid thermal annealed (at 1000° C. for 10 seconds in nitrogen). The samples in groups A-C were then defined by lithography to form MOS capacitors (MOSCs) and then annealed at 400° C. in nitrogen for 30 minutes to form top gate electrodes. The back of the wafers served as the other electrode for the MOSC structures. For comparison, one more control wafer, CT-3, was prepared using in-situ doped BPSG deposited by atmospheric CVD. The CT-3 sample was not annealed. For charge injection measurements using UV light, a 15 nm thick layer of Au was evaporated through a mask onto the samples A-C to form a semitransparent top electrode of the MOSC structures. No annealing was done after the Au deposition.

A net amount of charge trapped in the samples of groups A-C, as a result of either x-ray exposure or charge injection, was determined by the shift in 1 MHz C-V curves. The samples were irradiated to a dose of 1 Mrad using a 10 keV ARACOR Model 4100 X-ray source. During irradiation, the MOSC gate electrodes were biased at +10 V, equivalent to a field of about 0.25 MV/cm across the oxide.

Values of flatband voltage shifts ($\Delta V_{fb}$) following the 1 Mrad x-ray exposure are given in Table 2. Several samples, especially the B2 and C2 samples, are seen to be harder than the control sample CT-1. During irradiation, the top electrode was biased to +10V.

TABLE 2

| Composition | Group A | Group B | Group C | Control |
|---|---|---|---|---|
| 1 | −50 | −33 | −20.5 | −19 (CT-1) |
| 2 | −26 | −17 | −13.5 | −22 (CT-2) |
| 3 | −21 | −20.5 | −19 | — |

Photo-assisted charge injection techniques were used to inject either electrons or holes into the oxide. During charge injection, the gate electrode was biased at +40 V to maintain a field of 1 MV/cm across the oxide. Electrons were injected into the oxide by illuminating the gate with ultraviolet (UV) light produced by a xenon arc lamp, resulting in the photoemission of electrons from the silicon substrate. These electrons are transported across the oxide in response to the positive gate bias. When silicon nanoclusters are present in the deposited oxide, photoemission of electrons from the clusters can occur resulting in the clusters becoming positively charged.

Holes were injected into the oxide by illuminating the semitransparent gate electrode with vacuum ultraviolet (VUV) light having an energy of 10.4 eV produced by a krypton photo-ionization lamp. As a result, electron-hole pairs are generated in the oxide within 10 nm of the gold electrode. In response to the applied field, the electrons moved a short distance back to the top gate electrode and the holes drift across the oxide. For electron and hole injection, the injected dose was determined by integrating the current flow during injection.

Figure 4A:
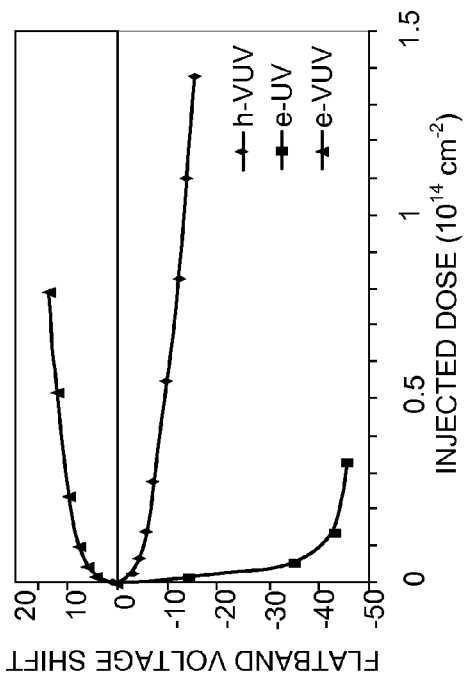
FIGS. 4A-C are graphs showing flat band voltage shifts associated with injected carriers in MHDPDX and non-MHDPDX films, according to an example.

FIG. 4A shows $\Delta V_{fb}$ as a function of the dose of injected holes and electrons for the sample C2, which, as discussed above, has the lowest value of $\Delta V_{fb}$ following 1 Mrad(SiO$_2$) X-ray irradiation. This sample also has the lowest value of $\Delta V_{fb}$ following hole injection. Note that electron injection resulted in negative values of $\Delta V_{fb}$ indicating a buildup of positive charge in the oxide during electron injection. This seemingly strange result can be understood by realizing that the silicon nanoclusters photoemit electrons during the UV electron injection, and therefore become positively charged, and is additional evidence of the presence of the silicon nanoclusters. Additional data (top curve), for electron injection using VUV light (with negative gate electrode bias) shows the expected positive shift of $V_{f}$, indicating that the silicon nanoclusters are also electron traps.

Therefore the decreased values of $\Delta V_{fb}$ following x-ray irradiation result from two factors. First, the silicon nanoclusters decrease positive charge trapping directly, and secondly, the silicon nanoclusters act as electron traps, which, during x-ray irradiation, can trap electrons and compensate some of the positive trapped charge.

Figure 4B:
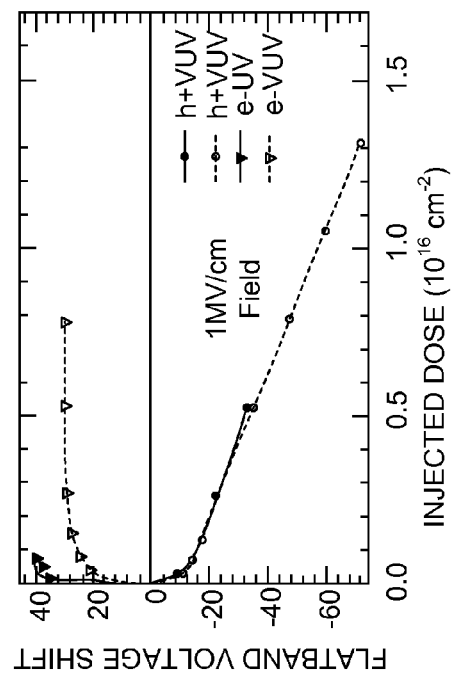

FIG. 4B shows hole and electron injection characteristics for the control sample CT-1. Note that hole trapping is larger in this oxide than in the oxide of sample C2, indicating the improved positive charge trapping of MHDPDX films over BPSG, in particular, MHDPDX films having an average silicon nanocluster size of about 3-5 nm. The electron trapping results shown in FIG. 4B suggest the presence of electron traps in the CT-1 sample. These traps, however, are not due to the presence of silicon nanoclusters, as in the silicon rich HDP deposited oxides, since no evidence of photoemission from silicon nanoclusters is observed in this oxide.

Figure 4C:
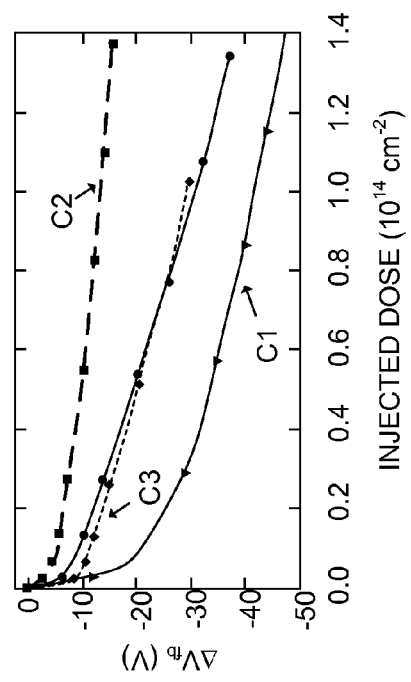

For a direct comparison, hole injection characteristics of the samples in group C and the control sample CT-3 are shown FIG. 4C. It is clear that the sample C2 is better than the control sample CT-3. The CT-3 sample is a state of the art BPSG film used in various SOI technologies with feature size larger than 0.35 μm. The CT-3 samples were prepared and in-situ doped in an atmospheric CVD deposition system (AME5000). The sample CT-3 is better than CT-1 sample from a hole trapping standpoint as seen by comparing the FIGS. 4A and 4B. The composition of the sample C2 was thus chosen for implementation in a SOI CMOS fabrication to evaluate the radiation hardness of a MOS device comprising an STI trench fill using the sample C2. Although the CMOS evaluation is primarily directed to using MHDPDX for STI trench fill, other dielectric layers may be MHDPDX based, or may be annealed to increase the average silicon nanocluster size. For example, in FIG. 1, any of the layers 16, 18, 20, 32, and 34 may comprise silicon nanoclusters.

CMOS Evaluation

For back gate threshold voltage measurements involving MHDPDX in STI, NMOS transistors were fabricated using a 0.25 μm SOI CMOS technology. The thickness of the top silicon and the buried oxide of the SOI substrates used for fabricating 0.25 μm NMOS transistors for back gate $V_t$ measurements were 165 nm and 170 nm, respectively. Back gate threshold voltage was taken at a voltage in back channel Tds-Vg2 characteristics (Vg2 is back gate voltage) at a current of 50 pA/35 μm. For example, back gate voltage is taken at the back gate voltage for the current equal to 200 pA in the case of the 4/0.24 NMOS transistor.

Generally speaking, the value of back gate $V_t$ of NMOS transistors depends on STI, buried oxide, and corner field. Keeping all parameters constant, the effect of MHDPDX and BPSG are compared, where back gate threshold voltages as a function of total dose were measure and shown in FIG. 5A. A 2.75V bias was applied to the source and drain with other electrodes grounded, corresponding to "pass-gate" irradiation biases. Each data point represents the average value of 15 die from 3 wafers.

BPSG (CT-1) results are shown in the bottom curve of FIG. 5A. MHDPDX (C2) results are shown in the top curve. A large difference in the pre-radiation $V_t$ values was observed. From edge-less 4/0.24 NMOS transistors, the pre-radiation V+ values are 20V and 6V respectively, signifying the sensitivity of the bottom corner. The radiation induced leakage currents as a function of total dose of the corresponding wafers under "pass-gate" irradiation bias are shown in FIG. 5B. As FIG. 5B shows, large conduction currents were observed for the sample CT-1, corresponding to negative $V_t$, while no appreciable leakage currents were observed for the sample C2 corresponding to positive back gate $V_t$ in FIG. 5A.

FIG. 5C shows an evaluation of the top gate edge leakage currents for "on-gate" irradiation biases. Such an evaluation is carried out as a CMP process may affect the STI corner oxide radiation properties. Under on-gate irradiation-biases, radiation-induced leakage currents as a function of total dose are shown in FIG. 5C for forty-six two-edged transistor arrays (standard layout). The "on-gate" bias conditions are $V_G$=2.75 V and the other terminals are set at 0V. The radiation hardness or sensitivity is seen to depend on the spacer oxides and the STI oxides. They are represented by three curves in FIG. 5C. Curve CT-1/C2 represents CT-1 spacer and C2 STI. Curve CT-1/CT-1 represents CT-1 spacer and CT-1 STI. Curve TEOS/C2 represents undoped TEOS spacer and C2 STI. FIG. 5C clearly shows that mixing doped (CT-1) spacer and undoped (C2) STI oxides may degrade the TID performance. It is contemplated that using both C2 based spacer and STI oxides would generate a curve similar to or better than the TEOS/C2 curve.

f) Conclusion

A variety of examples have been described above. The above description has described how to detect the presence of silicon nanoclusters in MHDPDX films by photoluminescence measurements. Also, the description has described how silicon nanoclusters act as electron traps to compensate some of the positive charge that would normally be trapped during X-ray irradiation. In addition, the charge injection results indicate that the silicon nanoclusters directly reduce hole trapping. Furthermore, the back gate $V_t$ results demonstrate that MHDPDX films may outperform BPSG in a total dose radiation environment. Since MHDPDX films do not contain $^{10}$B like conventional BPSG, it may be used to mitigate thermal neutron sensitivity.

Those skilled in the art will understand that changes and modifications may be made to these examples without departing from the true scope and spirit of the present invention, which is defined by the claims. Thus, for example, the description above generally describes the dielectric layer and/or the MHDPDX film as being a silicon oxide based layer, however other materials may be possible. Also, in particular, it is preferred that the silicon nanoclusters have an average size in the range of 3-5 nm, however, other sizes may be possible. Finally, a variety of anneals and thermal processing may be used to amalgamate silicon nanoclusters within an MHDPDX film.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A method for increasing the radiation hardness of a semiconductor device, the method comprising:
   depositing a dielectric layer including silicon nanoclusters in a trench adjacent to a semiconductor device location using a chemical vapor deposition process comprising a high density plasma deposition process performed using a silicon source gas comprising $SiH_4$ and an oxygen source gas comprising $O_2$ at a ratio that establishes an amount of excess silicon content so that the dielectric layer comprises the silicon nanoclusters and the excess silicon content; and
   increasing an average size of the nanoclusters by annealing the dielectric layer such that the excess silicon content migrates toward the silicon nanoclusters and causes an average size of the silicon nanoclusters to increase.

2. The method as in claim 1, wherein a time and a temperature associated with the anneal are determined so as to increase the average size of the nanoclusters to a range of about 3 to 5 nm.

3. The method as in claim 1, wherein increasing an average size of the nanoclusters comprises annealing the dielectric layer in a gas that does not oxidize the nanoclusters.

4. The method as in claim 3, wherein the gas is an inert gas selected from the group consisting of nitrogen ($N_2$) and argon (Ar).

5. The method as in claim 1, wherein the dielectric layer is annealed within a temperature range of about 750 to 850° C.

6. The method as in claim 1, wherein the dielectric layer is annealed for a time in a range of about 10 to 60 minutes.

7. The method as in claim 1, wherein the dielectric layer is annealed for about forty minutes at a temperature of about 800° C.

8. The method as in claim 1, wherein the dielectric layer comprises a portion of a buried oxide layer of a silicon on insulator substrate.

9. The method as in claim 1, wherein the dielectric layer comprises a portion of a field oxide layer.

10. The method as in claim 1, wherein the dielectric layer comprises a portion of a gate oxide layer.

11. The method as in claim 1, further comprising using a thermally oxidative process to grow a thermal oxide in the trench, wherein the dielectric layer is deposited on top of the thermal oxide.

12. The method as in claim 1, wherein depositing the dielectric layer comprising silicon nanoclusters comprises:
    depositing a silicon oxide layer; and
    implanting silicon atoms in the silicon oxide layer so as to create the nanoclusters.

13. A radiation hardened semiconductor device, comprising a silicon oxide layer including silicon nanoclusters deposited in a trench adjacent to a semiconductor device so that the silicon oxide layer is positioned to shield the semiconductor device from ionizing radiation,
    wherein the silicon oxide layer is deposited using a chemical vapor deposition process comprising a high density plasma deposition process performed using a silicon source gas comprising $SiH_4$ and an oxygen source gas comprising $O_2$ at a ratio that establishes an amount of excess silicon content so that the dielectric layer comprises the silicon nanoclusters and the excess silicon content,
    wherein an average size of the nanoclusters is increased by annealing the silicon oxide layer such that an excess silicon content migrates towards the existing silicon nanoclusters and causes the average size of the silicon nanoclusters to increase, and
    wherein the nanoclusters have a size that is in a range of about 3 to 5 nm.

14. The device as in claim 13, wherein the silicon oxide layer is a portion of an electrically isolating layer selected from the group consisting of a buried oxide, a field oxide, a gate oxide, and a shallow trench isolation oxide.

* * * * *